(12) United States Patent
Patwardhan et al.

(10) Patent No.: US 7,413,927 B1
(45) Date of Patent: Aug. 19, 2008

(54) APPARATUS FOR FORMING A PRE-APPLIED UNDERFILL ADHESIVE LAYER FOR SEMICONDUCTOR WAFER LEVEL CHIP-SCALE PACKAGES

(75) Inventors: Viraj A. Patwardhan, Sunnyvale, CA (US); Hau T. Nguyen, San Jose, CA (US); Nikhil Kelkar, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 11 days.

(21) Appl. No.: 11/264,604

(22) Filed: Oct. 31, 2005

Related U.S. Application Data

(62) Division of application No. 10/366,067, filed on Feb. 12, 2003.

(51) Int. Cl.
*H01L 21/50* (2006.01)
*H01L 21/48* (2006.01)
*H01L 21/44* (2006.01)

(52) U.S. Cl. .................. 438/108; 438/113; 438/114; 438/460; 438/462; 438/465

(58) Field of Classification Search ............... None
See application file for complete search history.

(56) References Cited

U.S. PATENT DOCUMENTS

| | | | |
|---|---|---|---|
| 5,008,189 A | 4/1991 | Oroskar et al. | |
| 5,128,746 A | 7/1992 | Pennisi et al. | |
| 5,136,365 A | 8/1992 | Pennisi et al. | |
| 5,214,308 A | 5/1993 | Nishiguchi et al. | |
| 5,244,143 A | 9/1993 | Ference et al. | |
| 5,250,843 A | 10/1993 | Eichelberger | |
| 5,329,423 A | 7/1994 | Scholz | |
| 5,376,403 A | 12/1994 | Capote et al. | |

(Continued)

OTHER PUBLICATIONS

Nguyen et al. Patent Application Entitled "Method and Apparatus for Forming an Underfill Adhesive Layer", U.S. Appl. No. 10/080,913, filed Feb. 21, 2002.

(Continued)

*Primary Examiner*—Zandra Smith
*Assistant Examiner*—Khanh B Duong
(74) *Attorney, Agent, or Firm*—Beyer Law Group LLP

(57) ABSTRACT

An apparatus and method for enhancing the formation of fillets around the periphery of assembled wafer-level chip scale packages when mounted onto substrates. The method includes fabricating a plurality of integrated circuit die on a first surface of a semiconductor wafer, each of the integrated circuit die being separated by scribe lines on the wafer. Once the circuitry has been fabricated, grooves are formed along the scribe lines on the first surface of the semiconductor wafer. The first surface of the semiconductor wafer is then covered with a layer of underfill material, including within the grooves formed along the scribe lines on the first surface of the semiconductor wafer. After the wafer is singulated, the resulting die includes a first top surface and a second bottom surface and four side surfaces. Integrated circuitry is formed on the first surface of the die. Recess regions created by cutting the grooves are formed on all four side surfaces of the die and filled with the underfill material. When the die is mounted to a substrate, the additional underfill material in the recess regions helps form more robust fillets than otherwise possible.

10 Claims, 5 Drawing Sheets

U.S. PATENT DOCUMENTS

| | | | |
|---|---|---|---|
| 5,495,439 | A | 2/1996 | Morihara |
| 5,500,534 | A | 3/1996 | Robinson et al. |
| 5,587,342 | A | 12/1996 | Lin et al. |
| 5,668,059 | A | 9/1997 | Christie et al. |
| 5,698,894 | A | 12/1997 | Bryant et al. |
| 5,736,456 | A | 4/1998 | Akram |
| 5,767,010 | A | 6/1998 | Mis et al. |
| 5,768,290 | A | 6/1998 | Akamatsu |
| 5,773,359 | A | 6/1998 | Mitchell et al. |
| 5,872,633 | A | 2/1999 | Holzapfel et al. |
| 5,880,530 | A | 3/1999 | Mashimoto et al. |
| 5,895,976 | A | 4/1999 | Morrell et al. |
| 5,925,936 | A | 7/1999 | Yamaji |
| 5,937,320 | A | 8/1999 | Andricacos et al. |
| 5,953,623 | A | 9/1999 | Boyko et al. |
| 5,977,632 | A | 11/1999 | Beddingfield |
| 6,023,094 | A | 2/2000 | Kao et al. |
| 6,060,373 | A | 5/2000 | Saitoh |
| 6,063,647 | A | 5/2000 | Chen et al. |
| 6,071,757 | A | 6/2000 | Fogal et al. |
| 6,100,114 | A | 8/2000 | Milkovich et al. |
| 6,121,689 | A | 9/2000 | Capote et al. |
| 6,130,473 | A | 10/2000 | Mostafazadeh et al. |
| 6,171,887 | B1 | 1/2001 | Yamaji |
| 6,190,940 | B1 | 2/2001 | Defelice et al. |
| 6,228,678 | B1 | 5/2001 | Gilleo et al. |
| 6,245,595 | B1 | 6/2001 | Nguyen et al. |
| 6,258,626 | B1 | 7/2001 | Wang et al. |
| 6,288,444 | B1 | 9/2001 | Abe et al. |
| 6,297,560 | B1 | 10/2001 | Capote et al. |
| 6,307,269 | B1 | 10/2001 | Akiyama et al. |
| 6,316,528 | B1 | 11/2001 | Iida et al. |
| 6,327,158 | B1 | 12/2001 | Kelkar et al. |
| 6,346,296 | B1 | 2/2002 | McCarthy et al. |
| 6,352,881 | B1 | 3/2002 | Nguyen et al. |
| 6,358,627 | B2 | 3/2002 | Benenati et al. |
| 6,372,547 | B2 | 4/2002 | Nakamura et al. |
| 6,391,683 | B1 | 5/2002 | Chiu et al. |
| 6,429,238 | B1 | 8/2002 | Sumita et al. |
| 6,455,920 | B2 | 9/2002 | Fukasawa et al. |
| 6,479,308 | B1 | 11/2002 | Eldridge |
| 6,486,562 | B1 | 11/2002 | Kato |
| 6,507,118 | B1 | 1/2003 | Schueller |
| 6,605,479 | B1 | 8/2003 | Pasadyn et al. |
| 6,649,445 | B1 | 11/2003 | Qi et al. |
| 6,683,379 | B2 | 1/2004 | Haji et al. |
| 6,791,194 | B1 | 9/2004 | Nagai et al. |
| 6,818,550 | B2 | 11/2004 | Shibata |
| 6,822,324 | B2 | 11/2004 | Tao et al. |
| 2002/0003299 | A1 | 1/2002 | Nakamura et al. |
| 2002/0014703 | A1 | 2/2002 | Capote et al. |
| 2002/0027257 | A1 | 3/2002 | Kinsman et al. |
| 2002/0031868 | A1 | 3/2002 | Capote |
| 2002/0109228 | A1 | 8/2002 | Buchwalter et al. |
| 2002/0171152 | A1 | 11/2002 | Miyazaki |
| 2003/0001283 | A1 | 1/2003 | Kumamoto |
| 2003/0013233 | A1 | 1/2003 | Shibata |
| 2003/0080360 | A1 | 5/2003 | Lee et al. |
| 2003/0087475 | A1 | 5/2003 | Sterrett et al. |
| 2003/0099767 | A1 | 5/2003 | Fang |
| 2003/0127502 | A1 | 7/2003 | Alvarez |
| 2003/0129789 | A1 | 7/2003 | Smith et al. |
| 2003/0169064 | A1 | 9/2003 | Pirkle et al. |
| 2003/0193096 | A1 | 10/2003 | Tao et al. |
| 2003/0218258 | A1 | 11/2003 | Charles et al. |
| 2004/0002181 | A1 | 1/2004 | Scheifers et al. |
| 2005/0516331 | | 7/2005 | Akram |
| 2005/0212142 | A1 | 9/2005 | Miyazaki et al. |

OTHER PUBLICATIONS

Nguyen et al., "Effect of Underfill Fillet Configuration on Flip Chip Package Reliability", SEMI® Technology Symposium: International Electronics Manfacturing Technology (IEMT) Symposium, SEMICON® West 2002.

"Flip Chip Products, Polymer Collar™ Wafer Level Package, Polymer Collar Overview", www.kns.com, downloaded Jan. 23, 2003.

"Flip Chip Products, Polymer Collar™ Wafer Level Package, See the Polymer Collar™ WLP Difference!", www.kns.com, downloaded Jan. 23, 2003.

Lau et al., "Solder-Bumped Flip Chip and Wire-Bonding Chip on CSP Substrate", Chip Scale Package, Design, Materials, Process, Reliability, and Applications, Chapter 1, pp. 1-41.

Morris et al., Fundamentals of Microsystems Packaging, Chapter 2, pp. 44-79, Chapter 10, pp. 398-418, Chapter 17, pp. 658-693.

Office Action mailed Aug. 4, 2005 in U.S. Appl. No. 10/224,291.

"Polymer Collar WLP™, Wafer Level Package Family", © 2002, downloaded from www.kns.com/prodserv/PDFS/FCD/polymer_collar.pdf, 2 pages.

"Presenting Polymer Collar WLP™—A New Wafer Level Package for Improved Solder Joint Reliability", © 2002, downloaded from www.kns.com/prodserv/flipchip/pdf/PC_ad.pdf, 1 page.

Barrett et al., Kulicke & Soffa, "Polymer Collar WLP™—A New Wafer Level Package for Improved Solder Joint Reliability", © 2002, downloaded from www.kns.com/resources/articles/PolymerCollar.pdf. 9 pages.

Bogatin, Eric, "All Dressed Up and Nowhere to Go"; Semiconductor International, May 1, 2002, downloaded Dec. 23, 2003, from www.reed-electronics.com/semiconductor/index.asp?layout=article@articleid=CA213812@rid=0&rme=0&cfd=1, 2 pages.

ly, the invention relates to apparatus and methods for enhancing
APPARATUS FOR FORMING A PRE-APPLIED UNDERFILL ADHESIVE LAYER FOR SEMICONDUCTOR WAFER LEVEL CHIP-SCALE PACKAGES

CROSS REFERENCE TO RELATED APPLICATIONS

This application is a divisional application of prior application Ser. No. 10/366,067, filed Feb. 12, 2003 from which priority under 35 U.S.C. §120 is claimed, and which is incorporated herein by reference in its entirety.

FIELD OF THE INVENTION

The present invention relates generally to a wafer level packaging process for integrated circuits. More particularly, the invention relates to apparatus and methods for enhancing the formation of fillets around the periphery of assembled wafer-level packages mounted to substrates.

BACKGROUND OF THE INVENTION

There are a number of conventional processes for packaging integrated circuits. One approach which is commonly referred to as "flip chip" packaging generally contemplates forming solder bump contacts (or other suitable contacts) directly on an integrated circuit die on a wafer. After the contacts are formed, the dice are singulated by sawing or cutting the wafer along the scribe lines. The individual die can then be "flipped" and attached to a substrate such as a printed circuit board. That is, the solder bumps on the die are aligned and mounted onto matching contacts on the substrate. The solder bumps are then reflowed to electro-mechanically connect the die to the substrate.

When a flip chip die is mounted to the substrate, an air gap typically remains between the die and substrate. This gap is commonly filled with material that is flowed into the gap in liquid form and is then solidified. This material is generally a mixture of a epoxy resin and small silica spheres and is often called underfill. A dispenser or nozzle is typically used to dispense the liquid underfill material at one edge of the die. The material then flows into the narrow gap due to capillary action and spreads across the flip chip die until finally the entire area of the gap between the die and substrate is filled. The underfill material is then cured.

Since the silicon of the flip chip package and the substrate have different coefficients of thermal expansion, the solder joints may fail during normal operation. The solidified or cured underfill material helps maintain the integrity of the solder joints, which in turn, helps to reduce failure of the joints in the field.

As a general rule with wafer-level chip scale packages, it is desirable that sufficient underfill material be present so that a fillet is formed around the die when it is mounted onto a substrate, such as a printed circuit board. During this process, the elevated temperatures causes the partially cured underfill material to flow and to fully cure. Fillets of underfill material are formed as a result around the periphery of the wafer-level chip scale packages. Generally speaking, the more underfill material present on the periphery of the die, the larger and more robust the fillet. It is therefore desirable to have additional underfill material at these locations. For more details on the benefits of fillets, see "Effects of Underfill Fillet Configuration on Flip Chip Packaging Reliability", by H. Nguyen et al., the International Electronics Manufacturing Technology Symposium, SEMICON West, July, 2002.

There are problems associated with aforementioned type of underfill process. For example, the operation of applying underfill must be repeated for each flip chip mounted onto a substrate. Repeating such an operation many times during manufacturing significantly increases costs.

An apparatus and method for enhancing the formation of fillets around the periphery of assembled wafer-level packages when mounted onto substrates is therefore needed.

SUMMARY OF THE INVENTION

To achieve the foregoing and other objects and in accordance with the purpose of the present invention, an apparatus for enhancing the formation of fillets around the periphery of assembled wafer-level chip scale packages when mounted onto substrates is disclosed. The apparatus includes a semiconductor wafer having a plurality of integrated circuit dice formed on a first surface of the wafer. The dice are separated from one another by scribe lines. Grooves, filled with an underfill material, are formed along the scribe lines. The underfill material in the grooves increases the amount of underfill material present at the periphery of the individual die after the wafer is described. When the chip is mounted to a substrate, the additional underfill material results in a more robust fillet being formed around the periphery of the die after reflow and curing.

BRIEF DESCRIPTION OF THE DRAWINGS

The features of the present invention may best be understood by reference to the following description of the presently preferred embodiments together with the accompanying drawings. For the sake of clarity the drawings are not to scale.

FIG. 1 (*b*) is a surface mount semiconductor die scribed from the wafer of FIG. 1(*a*).

DETAILED DESCRIPTION OF THE INVENTION

Figure 1A:
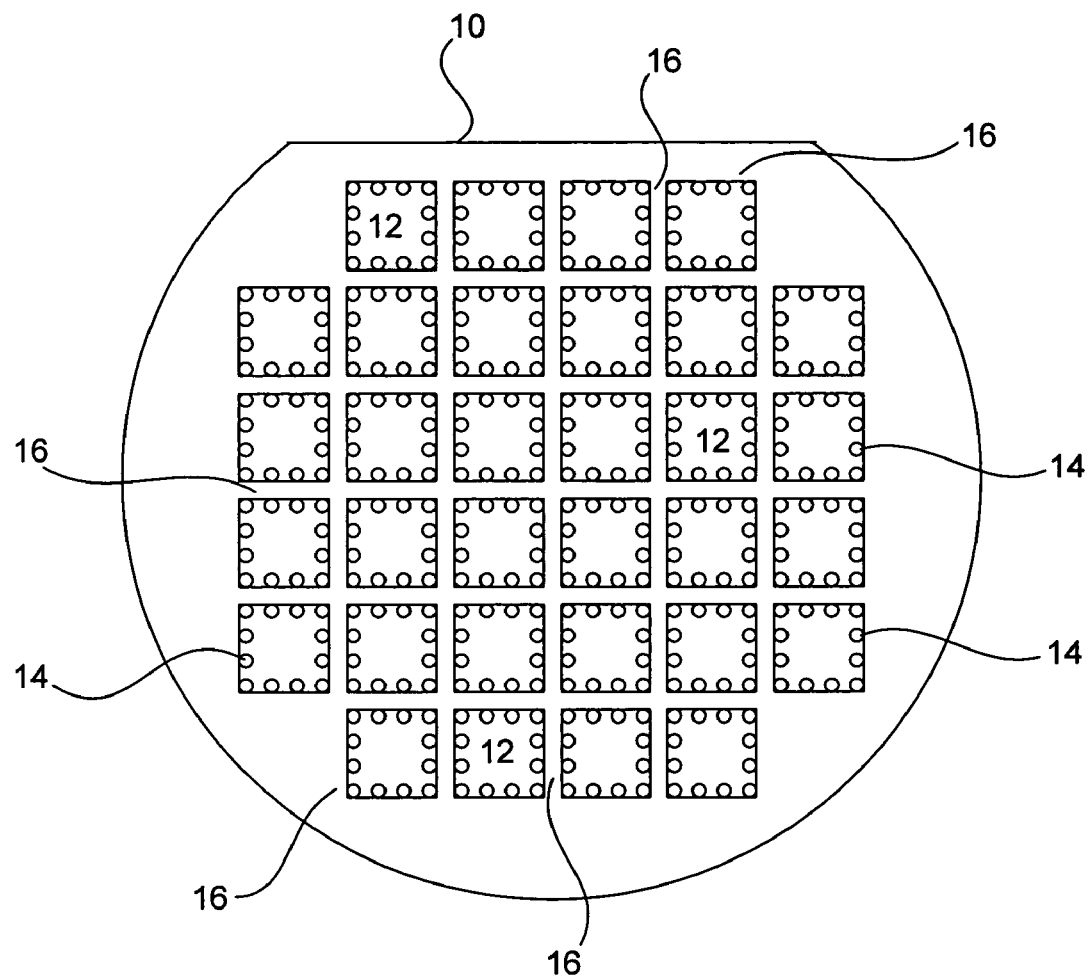
FIG. 1 (*a*) is a wafer with surface mount semiconductor dice fabricated thereon.
Figure 1B:
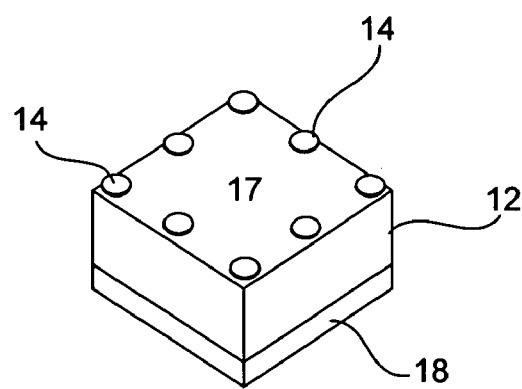

Referring to FIG. 1 (*a*), a wafer 10 with a plurality of integrated circuit semiconductor dice 12 fabricated thereon is shown. Each die 12 includes a plurality of solder balls 14 which are used to attach the singulated die 12 to a substrate (not shown), such as a printed circuit board. A plurality of horizontal and vertical scribe lines 16 (sometimes referred to as "saw streets") are provided to separate the individual dice 12 on the wafer. After the die 12 are fabricated, the individual die 12 are singulated from the wafer by cutting or sawing the wafer along the scribe lines 16.

Referring to FIG. 1 (b) a singulated die 12 scribed from the wafer 10 is shown. The die 12 includes an active or first surface 17 where the integrated circuitry (not shown) of the device is fabricated and the solder balls 14 are formed. On the second or bottom surface, a backside epoxy layer 18 is provided. The die 12 also includes four sides, each on the periphery of the device. The type of die 12 illustrated in this figure is often referred to as a "wafer-level chip scale package" or surface mount device because it can be flipped and mounted directly onto a surface. For example when a printed circuit board is to be populated, the solder balls 14 are placed in contact and aligned with mating contacts on the board. The board is then subject to a solder reflow procedure in which elevated temperatures cause the solder of the balls 14 to reflow, forming an electro-mechanical joint between the die 12 and board.

Figure 2:
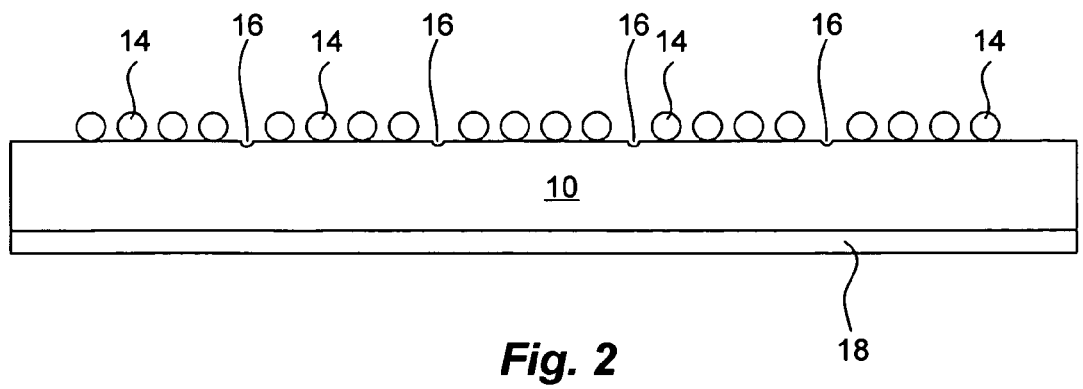
FIG. 2 is a cross-section of the wafer of FIG. 1(*a*).

Referring to FIG. 2, a cross-section of the wafer 10 is shown. From this view, the solder balls 14 are visible on the top surface of the wafer 10 and the backside epoxy layer 18 is shown on the bottom surface of the wafer 10. Cross sections of the scribe lines 16 are also visible on the top surface of the wafer 10. It should be understood that only those scribe lines 16 running in a direction perpendicular to the cross section are visible. The scribe line 16 running in the direction parallel to the cross section are not visible in this figure.

As described in co-pending U.S. application Ser. No. 10/080,913, entitled "Method and Apparatus for Forming an Underfill Adhesive Layer", by Nguyen et al., and assigned to the assignee of the present invention and incorporated by reference herein, a technique of applying an adhesive underfill layer to the top or active surface 17 of the wafer 10 is disclosed. In one embodiment of this application, the layer of underfill adhesive is dispensed and partially cured on the active surface of the wafer 10. Once the underfill adhesive has partially cured, the wafer is singulated. The individual wafer-level chip scale package devices or die 12 are then mounted onto a substrate such as a printed circuit board. The solder balls 14 of the die 12 are then heated to an elevated temperature (above the solder liquid temperature) during the reflow process. The elevated temperatures cause the solder balls 14 to reflowed to form joints with corresponding contact pads on the substrate and the underfill adhesive to completely cure. In an alternative embodiment, the underfill adhesive is fully cured after it is disposed onto the active surface 17 of the dice 12 on the wafer 10. In various other embodiments, the underflow adhesive is disposed onto the wafer 10 using stencil printing, screen printing, molding, or a spin-on deposition process. The underfill adhesive is selected from a group of materials including, but not limited to, epoxies, poly-imides, or silicone-polyamides copolymers and includes one or more of the following components: epoxy resin, a hardener, a catalyst initiator, a coloring dye and an inorganic filler.

With the present invention, which is directed to apparatus and methods for enhancing the formation of fillets around the periphery of surface mount flip chip packages when mounted onto substrates, the aforementioned process of applying the underfill layer is modified. Specifically, broad or wide grooves are formed in the wafer 10 along the horizontal and vertical scribe lines 16. The underfill adhesive flows into and fills the grooves when it is applied to the active surface of the wafer using stencil printing, screen printing, molding, or a spin on deposition process. In this manner, additional underfill material is present on the four peripheral sides of each die 12 after the adhesive is either partially or fully cured and the wafer is singulated. In one embodiment, a narrow dicing saw (relative to the width of the groove) is used to cut through and singulate the individual die 12. As a result, as is described below in more detail with respect to FIGS. 3 through 10, enhanced fillets are formed when the dice 12 are mounted to a substrate.

Figure 3:
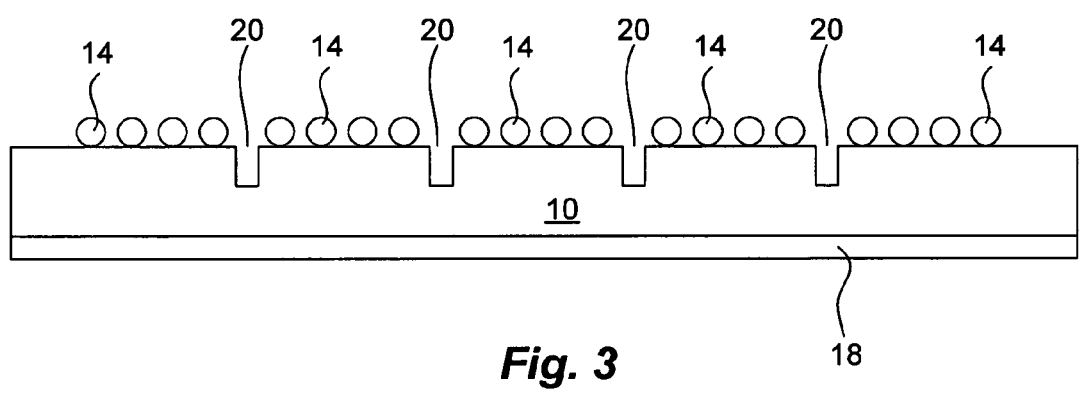
FIG. 3 is a cross section showing grooves cut along the scribe lines of a wafer according to one embodiment of the present invention.

Referring to FIG. 3, a cross section of the wafer 10 showing grooves cut along the scribe lines 16 according to the present invention is shown. The grooves 20 are formed by cutting or sawing the wafer 10 using a standard dicing saw having a blade that is wider than what is ordinarily used for singulating the die 12 on the wafer. In various embodiments of the invention, the grooves have a width ranging from 1 to 4 mils and a depth ranging from 25% to 75% of the total thickness of the wafer 10. In one specific embodiment, the grooves 20 have a width of 2.5 mils and a depth of approximately 200 microns with a wafer having a thickness of approximately 300 microns. It should be noted that these values are exemplary and in no way should be construed as limiting the invention.

Figure 4:
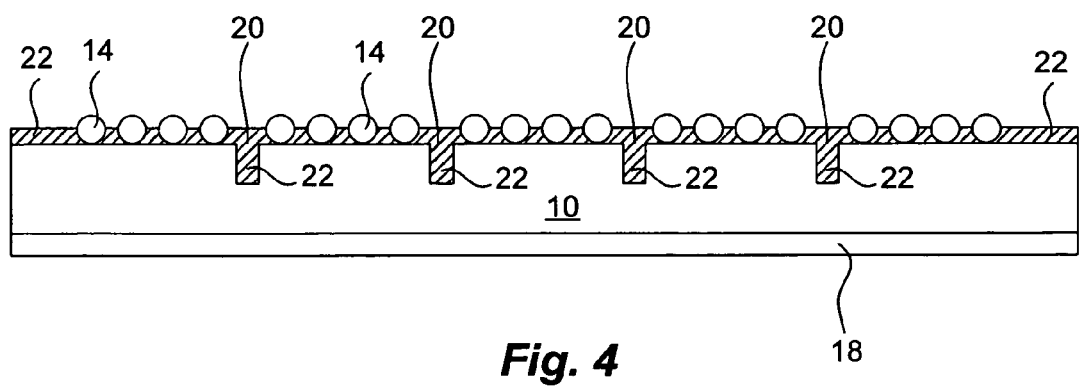
FIG. 4 illustrates a cross section of underfill material provided on the surface and within the grooves of the wafer according to the present invention.

Referring to FIG. 4, a cross section of wafer 10 with underfill material 22 provided on the active surface 17 of the dice 12 and within the grooves 20 is shown. When the underfill material is first applied to the active surface of the wafer 10, it is in a non-cured or A-stage state. The underfill material therefore readily flows into the grooves 20 formed in the wafer 10. Again, the underfill material 22 may be applied using stencil printing, screen printing, molding, or a spin on deposition process, as described in the aforementioned co-pending application.

Again, with regard to the cross sections of FIGS. 3 and 4, it should be understood that only those grooves 20 running in a direction perpendicular to the cross section are visible. The grooves 20 running in the direction parallel to the cross section are not visible in this figure.

Figure 5:
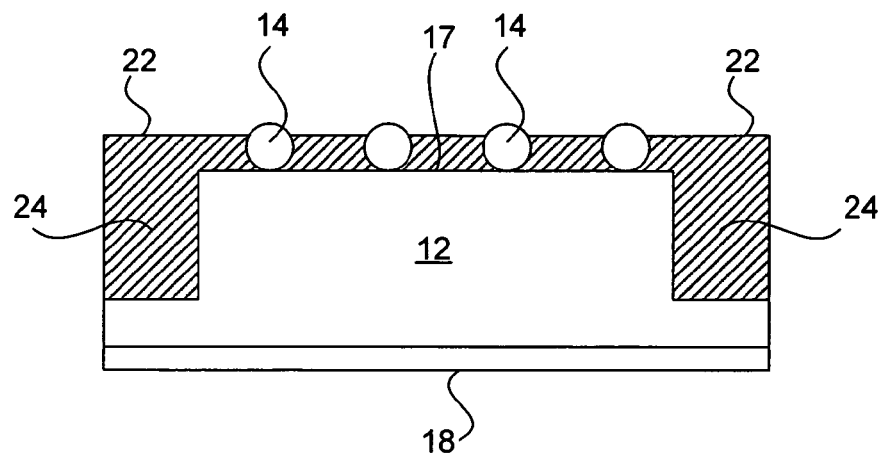
FIG. 5 illustrates a cross section of a die scribed from the wafer according to the present invention.

Referring to FIG. 5, a cross section of a die 12 scribed from the wafer 10 according to the present invention is shown. The die 12 includes solder balls 14 formed on the active surface 17 of the die and the back layer 18 formed on the second surface of the die 12. The die 12 also include four recess regions 24, each formed on each side of the die 12. The recess regions 24 are formed by the sawing operation described above when the grooves 20 are cut along the scribe lines 16. The underfill material 22 is shown filling the recess regions 24 and covering the active surface 17 of the die 12.

Figure 6:
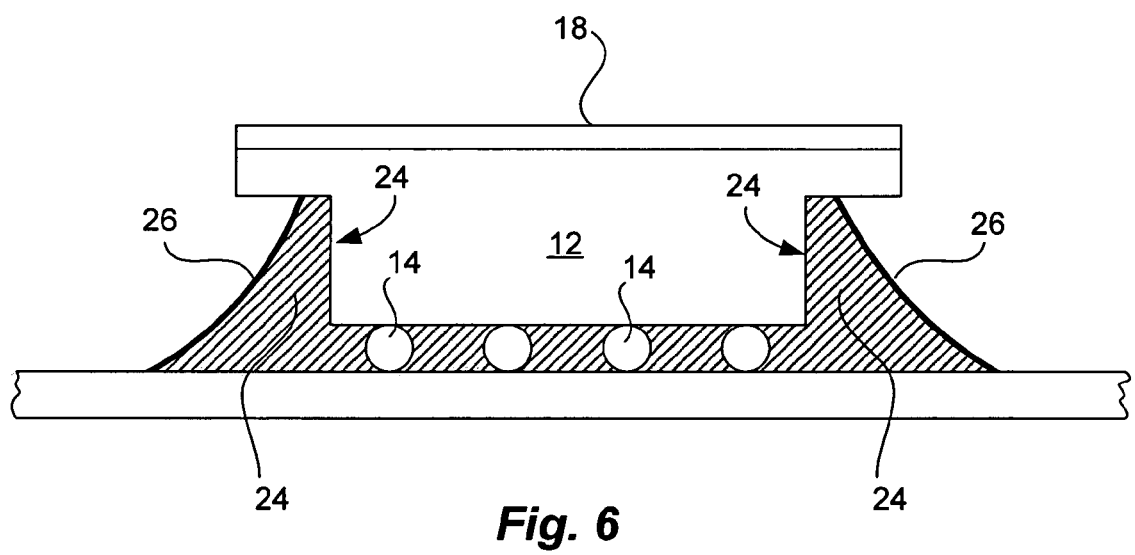
FIG. 6 illustrates a cross section of the die scribed from the wafer attached to a substrate according to the present invention.

FIG. 6 illustrates a cross section of the die 12 of FIG. 5 attached to a substrate according to the present invention. During attachment, the die is flipped so that the solder balls 14 are facing down and are aligned with mating contacts on the substrate. The board then undergoes a solder reflow operation which causes the solder of the balls 14 to reflow, forming an electro-mechanical joint between the die 12 and the board. During the reflow operation, the elevated temperatures also causes the underfill material 12 to reflow and cure, forming fillets 26 on all four sides of the die. Since the additional underfill material 22 within the recess regions 24 is substantially more than would otherwise be present, the quality and robustness of the resulting fillets 26 are superior than previously obtained using prior techniques.

Figure 7:
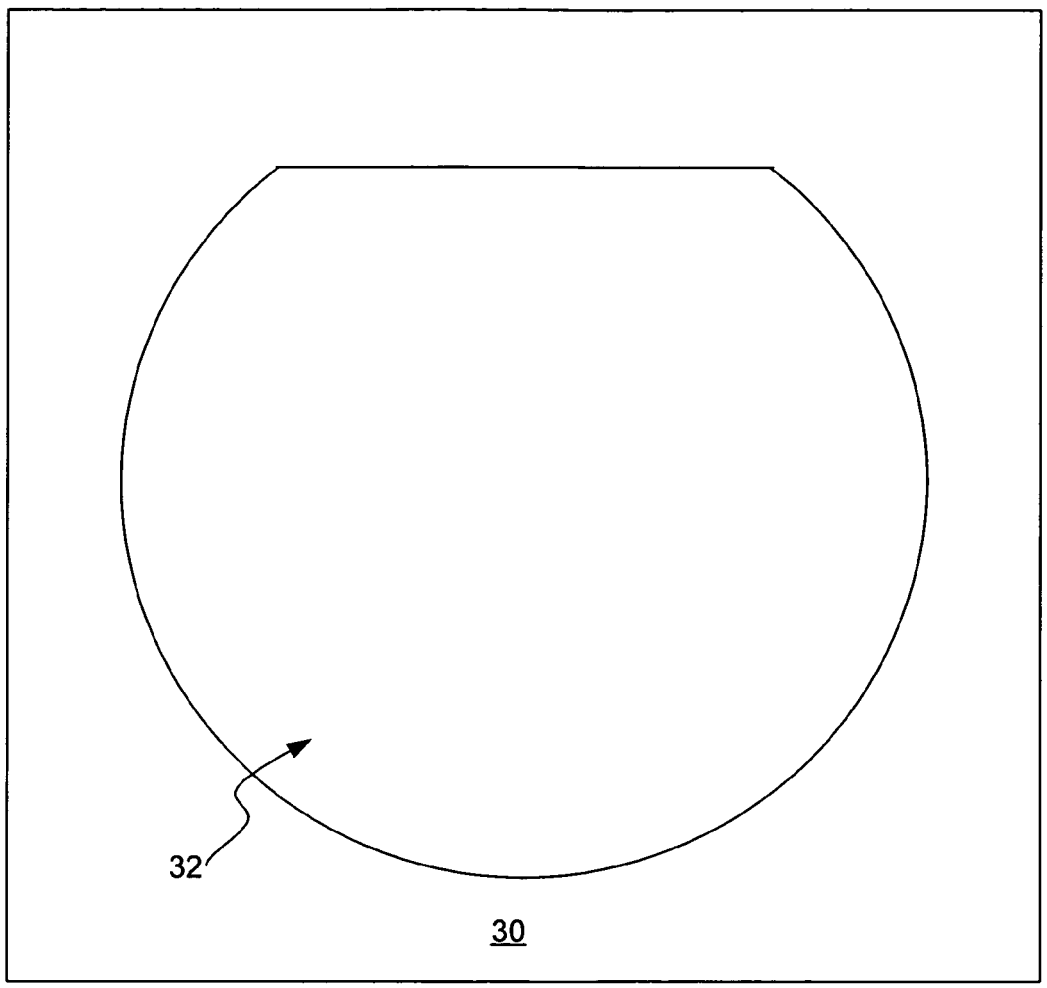
FIG. 7 is an in-situ stencil used to apply underfill material to the wafer according to the present invention.

Referring to FIG. 7, an in-situ stencil used to apply underfill material to the wafer 10 according to the present invention is shown. The stencil 30 includes an opening 32 that has the same general shape as the wafer 10. According to various embodiments of the invention, the in-situ stencil is made of any polymeric or metal-based material that can withstand the temperatures at which the underfill material 22 is cured. For example, the in-situ stencil may be made of a metal such as but not limited to stainless steel, brass, any type of polymer, silicates, glass, etc.

Figure 8:
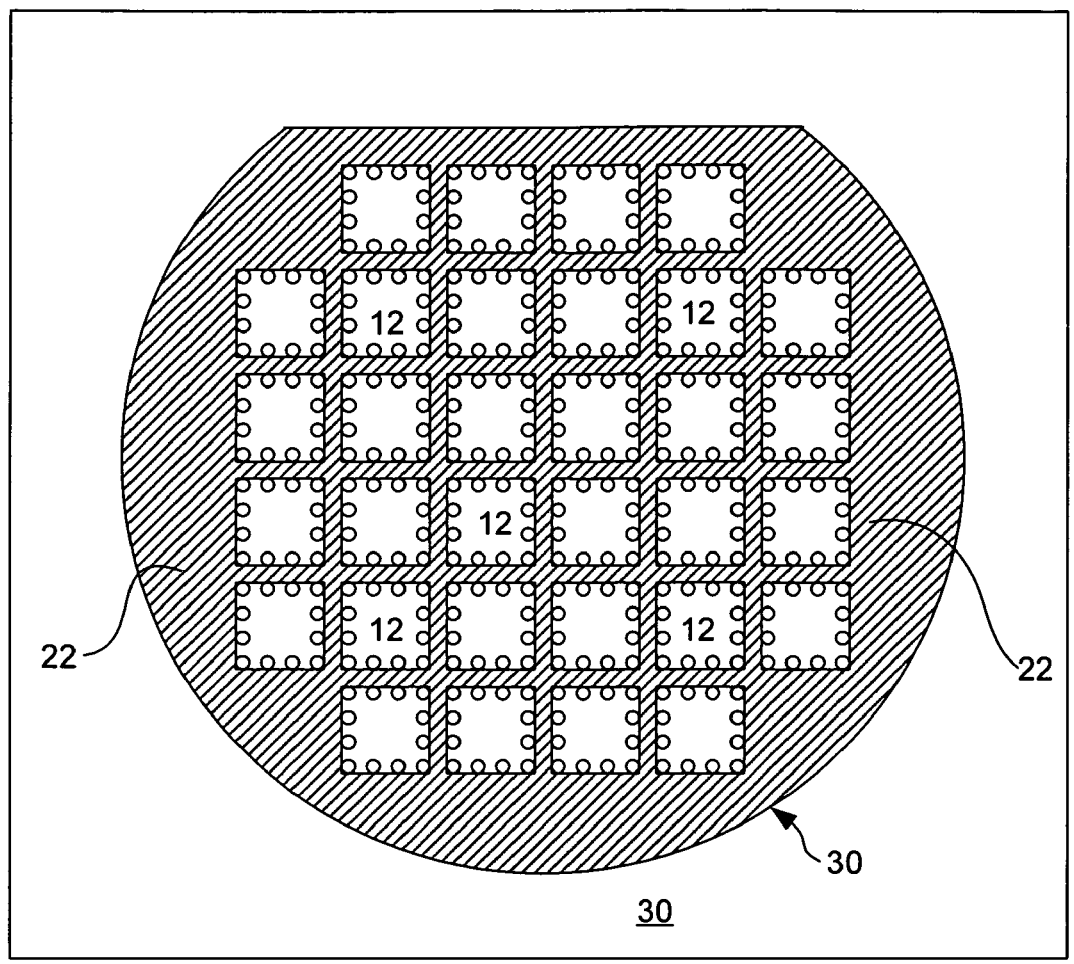
FIG. 8 illustrates the in-situ stencil on the wafer according to the present invention.

Referring to FIG. 8, the in-situ stencil 30 provided on the wafer 10 according to the present invention is shown. The opening 32 fits over the wafer 10 so the underfill material 22 (represented by cross-hatched lines) is prevented from flowing off the periphery of the wafer 10 when it is applied. The in-situ stencil 30 is also designed to remain in place on the wafer 10 while the underfill material 22 is cured on the wafer. This ensures that the underfill material 22 does not flow off the wafer before a full or partial curing. As a result, the underfill material assumes a substantially uniform height across the entire surface of the wafer 10. According to various embodiments of the invention, the underflow material 22 may be either fully or partially cured on the wafer 10.

Figure 9:
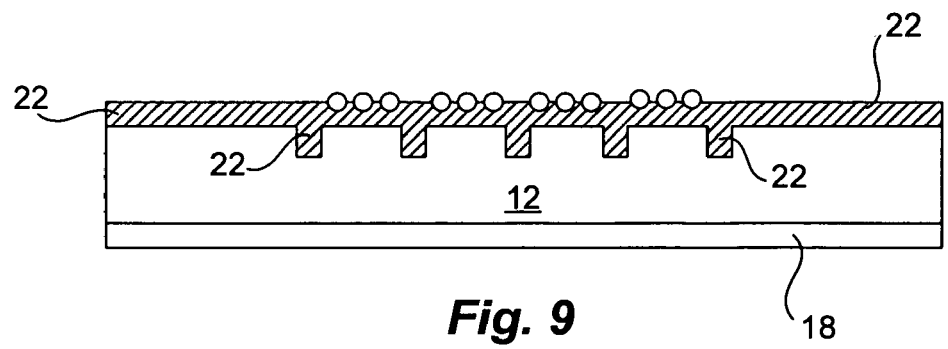
FIG. 9 illustrates a cross section of the wafer after underfill material has been applied to the wafer and the in-situ stencil has been removed from the wafer according to the present invention.

Referring FIG. 9, a cross section view of the wafer after the underfill material has been cured and the in-situ stencil has been removed is shown. As is evident from the figure, the underfill material 22 has a uniform thickness across entire surface of the wafer and does not slope downward at the periphery of the wafer.

In various embodiments of the invention, an underfill layer is applied to the wafer 100 before the wafer is diced. The underfill may be applied in a variety of different manners including, for example, stencil printing, screen printing, molding or spin coating. In many embodiments, a B-stageable adhesive material (such as a B-stageable epoxy) is used to form the underfill material. Typically, the wafer 10 will have the solder balls 14 before the underfill material 22 is applied. When a B-stageable underfill adhesive material is used, the underfill material is either partially or fully cured after being applied. In either state, the wafer 10 can be readily handled and diced thereby singulating the individual die 12. The resulting dice 12 can then be secured to any suitable substrate (such as printed circuit boards, package substrates, etc.) using conventional solder reflow techniques. In situations where the underfill material 22 is only partially cured, the properties of the underfill adhesive may be chosen so that the reflow process for the formation of the solder contacts during mounting finally cures the underfill adhesive at the same time. In other embodiments of the invention, a B-stageable underfill adhesive can be applied to the active surface 17 of the dice 12 of the wafer 10 and then fully cured.

More specifically, after the solder balls 16 have been formed, a layer of underfill 22 is applied across the wafer 10. As noted, the underfill adhesive 22 may be applied using a wide variety of techniques including stencil printing, screen printing, molding or spin-on processes. Each technique for applying underfill has advantages and disadvantages. By way of example, molding works well and uses readily available equipment. As described in the previously referenced U.S. Pat. No. 6,245,595, the balls 106 are typically (although not always) flattened in the molding operation which can be an advantage or a disadvantage depending on the application. Screen printing allows the application of variable thickness coatings using inexpensive tooling screens. Typically, when screen printing is used, a relatively low to medium solvent-based resin formulation may be used as the underfill material. Stencil printing tends to provide better height control than screen printing, although the stencils tend to be more expensive than screens. As is well known to those familiar with the art, stencils used in conventional stencil printing operations typically have a relatively large opening in a relatively rigid sheet of material such as metal. The opening(s) is/are shaped to match that of the area(s) being printed. Otherwise, stencil printing is quite similar to screen printing. Typically underfill material with somewhat higher solvent percentages are used during stencil printing than screen printing.

In one embodiment of the invention, the applicants recommend using an underfill material 22 having the following properties: viscosity: 2,000 to 20,000 mPa·s (milli Pascal·second); specific gravity: 1.0 to 1.4; solvent content: 20 to 45% (by weight); B-stage cure time of 20 to 30 minutes at 100 to 150 degrees C. under vacuum; and filler content: 1-10% (by weight). Solvent is added mainly to control the viscosity of the formulation, which includes epoxy resin, hardener, initiators (catalysts), dye (for color), and inorganic fillers. Key desirable properties of the underfill are: high glass transition temperature (Tg), low coefficient of thermal expansion (CTE), and good adhesion. High Tg material allows the underfill material to go through high temperature reflow with low risk of coating damage. High Tg materials are also obtainable through high molecular weight resins. Low CTE property is obtained through high filler loading. A preferred loading concentration aims to produce materials with CTEs between that of silicon ($3\times10-6$ ppm/C) and the substrate ($15\times10-6$ ppm/C) the die will be mounted on. Both options (high Tg and low CTE) tend to raise the viscosity of the formulation, and can be controlled by adding solvent.

By way of example, an underfill material 22 having a coefficient of thermal expansion in the range of approximately $20\times10-6$/K to approximately $30\times10-6$/K@$25°$ C., typically works well in order to reduce thermally induced stress. The coefficient of thermal expansion value of typical solder balls 16 is also in this range. Close agreement between the CTE values of these materials minimizes the generation of shear stresses between the underfill and the solder ball joints. One advantage to reducing thermal mis-match related stress is that the overall reliability of the electrical connection formed by the solder joint is greatly enhanced.

In one specific embodiment, an underfill material 22 having a solvent content of 40% is used. The observed advantages of using this percentage include: a lower viscosity so that flow coverage over the solder bumps and wafer passivation is enhanced; lower potential for air entrapment during coating; a lower incidence of microscopic voiding trapped at the base of the solder bumps; and an optimized B-stage curing profile. Too much solvent does not allow for proper flow.

With the use of an underfill 22 material with the above-defined characteristics, the applicants have found much of the solvent tends to evaporate during the curing process. Thus, the initial thickness of the underfill layer 22 applied to the active surface of the wafer 10 needs to take into account the reduction in thickness due to solvent loss. In this example, the applicants have found that in order to produce a layer of underfill having a thickness that has a height substantially the same as the solder balls 16, the pre-curing thickness of the material needs to be approximately 140% of the height of the solder balls 16. In various other embodiments of the invention, an underfill material with a lower solvent content may be used. With the solvent content lower, the amount of solvent loss will be less. Therefore, the height of the underfill layer before curing needs to be selected so that the final cure height is at the desired level, typically at a height such that at least the top surface of the solder balls 16 are exposed.

Although only a few embodiments of the present invention have been described in detail, it should be understood that the present invention may be embodied in many other specific forms without departing from the spirit or scope of the invention. Therefore, the present examples are to be considered as illustrative and not restrictive, and the invention is not to be limited to the details given herein but may be modified within the scope of the appended claims.

The invention claimed is:

1. A method comprising:
   fabricating a plurality of integrated circuit dice on a first surface of a semiconductor wafer, the dice separated from one another on the first surface by scribe lines;
   forming grooves along the scribe lines on the first surface of the semiconductor wafer, the grooves being sufficiently wide to form recess regions on the first surface in the dice; and
   providing a re-flowable underfill material within the grooves and recess regions substantially across the first surface of the semiconductor wafer, the re-flowable underfill material substantially filling the recess regions; and
   singulating the dice by cutting along the scribe lines, wherein the width of the cut is less than the width of the grooves such that some of the re-flowable underfill material covers side portions of the singlated dice, and wherein sufficient underfill material remains on side portions of the singulated dice after the singulation to enhance the formation of fillets between the individual die and a substrate after the dice are singulated from the wafer and mounted onto the substrate.

2. The method of claim 1, wherein the provided underfill material is a B-stageable adhesive that has at least one of the following properties: a viscosity of 2,000 to 20,000 milli-Pascals per second, a specific gravity of 1.0 to 1.4, a solvent content ranging from 20% to 40% by weight, a B-stage cure time of 15 to 40 minutes at 100 to 150 degrees C. under vacuum, and a filler content of 1% to 10% by weight.

3. The method of claim 1, further comprising forming a plurality of solder balls on each of the dice prior to providing the re-flowable underfill material within the grooves and recess regions substantially across the first surface of the semiconductor wafer, wherein the underfill material is provided at such a height that the solder balls are at least partially exposed after the underfill material is cured.

4. The method of claim 1, further comprising at least partially curing the re-flowable underfill material after it has provided within the grooves and recess regions substantially across the first surface of the semiconductor wafer.

5. A method as recited in claim 1 further comprising soldering a selected one of the singulated dice to a substrate and reflowing the underfill material to provide an underfill bond between the selected die and the substrate.

6. A method, comprising:
   fabricating a plurality of dice on a first surface of a semiconductor wafer, the dice being separated from one another by scribe lines formed on the first surface of the wafer;
   forming recess regions in the plurality of dice along the plurality of scribe lines on the first surface of the wafer;
   covering the first surface and filling the recess regions of the semiconductor wafer with a re-flowable underfill material; and
   singulating the plurality of dice from the semiconductor wafer by separating the wafer along the scribe lines on the wafer,
   wherein the width of separating cuts used to singulate the dice is less than the width of the recess regions such that some of the re-flowable underfill material covers side portions of the singlated dice, and wherein sufficient underfill material remains on side portions of the singulated dice after the singulation to enhance the formation of fillets between the individual die and a substrate after the dice are singulated from the wafer and mounted onto the substrate.

7. The method of claim 6, further comprising partially curing the underfill material after covering the first surface and filling the recess regions of the semiconductor wafer with the re-flowable underfill material.

8. The method of claim 6, further comprising fully curing the underfill material after covering the first surface and filling the recess regions of the semiconductor wafer with the re-flowable underfill material.

9. The method of claim 6, wherein the underfill material has at least one of the following properties: a viscosity of 2,000 to 20,000 milli-Pascals per second, a specific gravity of 1.0 to 1.4, a solvent content ranging from 20% to 40% by weight, a B-stage cure time of 15 to 40 minutes at 100 to 150 degrees C. under vacuum, and a filler content of 1% to 10% by weight.

10. A method comprising:
    fabricating a plurality of dice on a first surface of a semiconductor wafer, the dice being separated from one another by scribe lines formed on the first surface of the wafer;
    forming recess regions in the plurality of dice along the plurality of scribe lines on the first surface of the wafer;
    covering the first surface and filling the recess regions of the semiconductor wafer with a re-flowable underfill material;
    singulating the plurality of dice from the semiconductor wafer by separating the wafer along the scribe lines on the wafer such that the re-flowable underfill filled into the recess regions results in the re-flowable material being at least partially on all four sides of the singulated dice respectively; and
    forming fillets around the periphery of the singulated dice when the singulated dice are mounted onto a substrate, the underfill material in the recess regions on the periphery of the singulated dice used to enhance the formation of the fillets.

* * * * *

UNITED STATES PATENT AND TRADEMARK OFFICE
CERTIFICATE OF CORRECTION

| | |
|---|---|
| PATENT NO. | : 7,413,927 B1 |
| APPLICATION NO. | : 11/264604 |
| DATED | : August 19, 2008 |
| INVENTOR(S) | : Patwardhan et al. |

Page 1 of 1

It is certified that error appears in the above-identified patent and that said Letters Patent is hereby corrected as shown below:

Col. 6, line 26, change "20x10-6/K" to --$20 \times 10^{-6}/K$--.

Col. 6, line 26, change "20x10-6/K@25°C" to --$20 \times 10^{-6}/K@25°C$--.

CLAIMS:

Col. 7, line 18, (Claim 1) change "singlated" to --singulated--.

Signed and Sealed this

Eighteenth Day of November, 2008

JON W. DUDAS
*Director of the United States Patent and Trademark Office*